United States Patent
Tao et al.

(10) Patent No.: US 10,393,914 B2
(45) Date of Patent: Aug. 27, 2019

(54) SYSTEMS AND METHODS FOR DETECTING CONCEALED NUCLEAR MATERIAL

(75) Inventors: Rongjia Tao, Cherry Hill, NJ (US); Dong Ho Wu, Olney, MD (US)

(73) Assignees: US Gov't Represented By Secretary Of The Navy Chief Of Naval Research, Arlington, VA (US); Temple University Of The Commonwealth System Of Higher Education, Philadelphia, PA (US)

(*) Notice: Subject to any disclaimer, the term of this patent is extended or adjusted under 35 U.S.C. 154(b) by 886 days.

(21) Appl. No.: 13/148,120

(22) PCT Filed: Feb. 5, 2010

(86) PCT No.: PCT/US2010/023316
§ 371 (c)(1),
(2), (4) Date: Sep. 27, 2011

(87) PCT Pub. No.: WO2010/147681
PCT Pub. Date: Dec. 23, 2010

(65) Prior Publication Data
US 2012/0024044 A1    Feb. 2, 2012

Related U.S. Application Data

(60) Provisional application No. 61/150,119, filed on Feb. 5, 2009.

(51) Int. Cl.
*G01V 5/00*    (2006.01)
*G01R 29/24*   (2006.01)

(52) U.S. Cl.
CPC .......... *G01V 5/0075* (2013.01); *G01V 5/0091* (2013.01); *G01R 29/24* (2013.01)

(58) Field of Classification Search
CPC .......... G01T 1/167; G01T 1/185; G01T 1/14; G01T 1/178; G01T 7/00; G01T 3/00;
(Continued)

(56) References Cited

U.S. PATENT DOCUMENTS 2,472,153 A * 6/1949 Fearon ............... G01T 7/06
                                                        250/375
3,986,111 A * 10/1976 Sellers ............... G01N 27/62
                                                        250/282
(Continued)

FOREIGN PATENT DOCUMENTS

JP         08248135 A  *  9/1996
WO    WO 2008-091400       7/2008

OTHER PUBLICATIONS

"Nonproliferation and Safeguarding via Ionization Detection," Koster et al. (Year: 1995).*
(Continued)

*Primary Examiner* — Lily C Garner
(74) *Attorney, Agent, or Firm* — RatnerPrestia

(57) ABSTRACT

Methods and systems for detecting nuclear material concealed within an enclosure are provided. An ionized air density is measured at one or more locations outside of the enclosure. The presence of the concealed nuclear material is detected, for each of the one or more locations, based on a characteristic of the measured ionized air density indicative of concealed nuclear materials.

11 Claims, 6 Drawing Sheets

(58) Field of Classification Search
CPC .. G01T 1/02; G01T 1/026; G01T 1/24; G01T 1/244; G01T 3/008; G01T 3/08; G01T 1/20; G01T 1/22; G01T 1/006; G01T 1/16; G01T 1/1606; G01T 1/161; G01T 1/18; G01V 5/0091; G01V 5/0075; G01V 5/0025; G01V 5/0083; Y10S 250/02; G01N 2001/022; G01N 2001/021; G01N 2001/2223; G01N 2001/3586; G01R 29/24
USPC ..... 376/245, 249, 251, 253, 255; 250/336.1; 73/29.01, 53.01, 31.05, 61.45, 61.48, 73/61.43; 422/83
See application file for complete search history.

(56) References Cited

U.S. PATENT DOCUMENTS

| | | | | |
|---|---|---|---|---|
| 4,114,088 | A * | 9/1978 | Laws | G01N 27/62 324/464 |
| 4,451,736 | A * | 5/1984 | Cameron | 250/376 |
| 5,078,952 | A * | 1/1992 | Gozani et al. | 376/159 |
| 5,286,973 | A | 2/1994 | Westrom et al. | |
| 5,939,721 | A * | 8/1999 | Jacobsen et al. | 250/330 |
| 6,078,047 | A | 6/2000 | Mittleman et al. | |
| 6,234,006 | B1 | 5/2001 | Sunshine | |
| 6,281,502 | B1 | 8/2001 | Pineau et al. | |
| 6,448,562 | B1 * | 9/2002 | Seidler | G01T 3/00 250/358.1 |
| 6,480,141 | B1 | 11/2002 | Toth et al. | |
| 6,605,808 | B2 | 8/2003 | Mickan et al. | |
| 6,777,684 | B1 | 8/2004 | Volkov et al. | |
| 7,015,475 | B2 | 3/2006 | Hailey | |
| 7,098,463 | B2 * | 8/2006 | Adamovics | 250/474.1 |
| 7,120,226 | B2 | 10/2006 | Ledoux et al. | |
| 7,188,513 | B2 * | 3/2007 | Wilson | 73/31.05 |
| 7,358,863 | B2 | 4/2008 | Haney | |
| 7,378,658 | B2 | 5/2008 | Mueller et al. | |
| 7,385,549 | B2 | 6/2008 | Lovberg et al. | |
| 7,579,845 | B2 | 8/2009 | Peschmann et al. | |
| 7,728,296 | B2 | 6/2010 | Cole et al. | |
| 8,129,684 | B2 | 3/2012 | Mueller | |
| 8,247,775 | B2 | 8/2012 | Patel et al. | |
| 8,620,132 | B2 | 12/2013 | Rahman et al. | |
| 8,806,914 | B2 | 8/2014 | Brasfield | |
| 8,890,077 | B2 | 11/2014 | Rosson et al. | |
| 9,046,619 | B2 | 6/2015 | Blackburn et al. | |
| 2001/0033636 | A1 | 10/2001 | Hartick et al. | |
| 2002/0078771 | A1 * | 6/2002 | Kreichauf | G08B 21/12 73/866.5 |
| 2005/0082479 | A1 | 4/2005 | Wallace et al. | |
| 2006/0022140 | A1 | 2/2006 | Connelly et al. | |
| 2006/0169025 | A1 | 8/2006 | Wilson | |
| 2006/0255277 | A1 | 11/2006 | Cole et al. | |
| 2007/0145276 | A1 * | 6/2007 | Zhang | G01J 3/02 250/341.1 |
| 2007/0246652 | A1 * | 10/2007 | Gopalsami | G01J 3/42 250/336.1 |
| 2008/0283761 | A1 | 11/2008 | Robinson et al. | |
| 2008/0319321 | A1 | 12/2008 | Goldbach | |
| 2009/0086877 | A1 | 4/2009 | Hagelstein et al. | |
| 2009/0146060 | A1 | 6/2009 | Farshi | |
| 2009/0314943 | A1 | 12/2009 | Breit et al. | |
| 2010/0290487 | A1 | 11/2010 | Wu | |
| 2010/0326216 | A1 | 12/2010 | Nacson | |
| 2011/0273708 | A1 | 11/2011 | Tong | |

OTHER PUBLICATIONS

International Search Report for International Application No. PCT/US2010/023316, dated Jun. 15, 2011.
International Search Report for PCT/US2012/040439 dated Feb. 26, 2013.
International Preliminary Report on Patentability for PCT/US2012/040439 dated Dec. 2, 2013.
Office Action for U.S. Appl. No. 13/486,560 dated Jun. 19, 2015.
Office Action dated Jan. 7, 2016, U.S. Appl. No. 13/486,560.
Office Action for U.S. Appl. No. 13/486,560 dated Aug. 21, 2014.

* cited by examiner

SYSTEMS AND METHODS FOR DETECTING CONCEALED NUCLEAR MATERIAL

CROSS REFERENCE TO RELATED APPLICATIONS

This application is related to and claims the benefit of International Application No. PCT/US 2010/023316 entitled SYSTEMS AND METHODS FOR DETECTING CONCEALED NUCLEAR MATERIAL filed Feb. 5, 2010, and U.S. Provisional Application No. 61/150,119 entitled SYSTEMS AND METHODS FOR DETECTING CONCEALED NUCLEAR MATERIAL filed on Feb. 5, 2009, the contents of both are incorporated herein by reference.

FIELD OF THE INVENTION

The present invention relates to the nuclear field and, more particularly, to methods and systems for detecting concealed nuclear material.

BACKGROUND OF THE INVENTION

Detection of nuclear material (e.g., nuclear explosive devices, fissile material, and radiological material), both by in situ and remote detection, is important for national security and defense. Conventional nuclear detection technologies are based on the direct detection of nuclear radiation (e.g., the direct detection of gamma ($\gamma$) rays). Directly detecting hidden nuclear materials is more difficult. Hidden nuclear materials are typically shielded, with the shielding absorbing most of the nuclear radiation. Accordingly, there is typically a minimal concentration of nuclear radiation, making detection difficult.

For example, assume 10 kg of highly enriched uranium (HEU) is sealed in a lead container having 10 cm thick walls for shielding. The shielding absorbs all alpha ($\alpha$)-particles, beta ($\beta$)-particles, and low energy (e.g., <200 KeV) $\gamma$-rays. The shielding may also substantially reduce the rate of higher energy $\gamma$-ray and neutron emissions such that passive detection with $\gamma$-ray or neutron detectors becomes very difficult beyond a range of 1 meter. Even at a distance of 20 cm from the concealed radiation source, a portable $\gamma$-ray detector with sensitivity of 1 $\mu$R/h (radiation dose-equivalent with respect to rem (R)) may take over seven hours to generate a single measurement.

An alternative to passive detection is to use active neutron or muon interrogation. In active interrogation, the radiation source is bombarded with neutrons or muons, which introduce fissions in the source. Signatures of the neutron (or muon)-fissions are used to detect the nuclear radiation. The active interrogation method may be unsuitable for use on vehicles and cargo carriers, however, because of the presence of passengers.

The environmental sampling method, started at the International Atomic Energy Agency (IAEA), is generally considered to be the most sensitive and reliable method to confirm the existence or absence of undeclared nuclear materials or nuclear activities. The environmental sampling method, however, uses in situ field operations to collect environmental samples from surfaces of equipment, buildings, air, water, sediments or vegetation. This process is typically very slow and, thus, may not be suitable for nuclear detection applications at airports or boarder ports.

SUMMARY OF THE INVENTION

The present invention is embodied in a method for detecting nuclear material concealed within an enclosure. The method measures an ionized air density at one or more locations outside of the enclosure and detects, for each of the one or more locations, the presence of the concealed nuclear material based on a characteristic of the measured ionized air density indicative of concealed nuclear materials.

The present invention is also embodied in a system for detecting nuclear material concealed within an enclosure. The system includes an ionized air sensor configured to measure an ionized air density at one or more locations outside of the enclosure and a concealed nuclear material detector configured to detect, for each of the one or more locations, the presence of the concealed nuclear material based on a characteristic of the measured ionized air density indicative of concealed nuclear materials.

BRIEF DESCRIPTION OF THE DRAWINGS

The invention may be understood from the following detailed description when read in connection with the accompanying drawing. It is emphasized that, according to common practice, various features of the drawing may not be drawn to scale. On the contrary, the dimensions of the various features may be arbitrarily expanded or reduced for clarity. Moreover, in the drawing, common numerical references are used to represent like features. Included in the drawing are the following figures.

DETAILED DESCRIPTION OF THE INVENTION

As a general overview, and as will be described in detail below, the present invention is related to methods and systems for detecting concealed nuclear material (i.e., nuclear explosive devices, fissile material, radiological material, nuclear sites and nuclear activities) based on the detection of changes in the atmosphere surrounding the nuclear material. An exemplary concealed nuclear material (CNM) system detects ionized air and identifies characteristics of the ionized air indicating the presence of the concealed nuclear material. The present invention may be used for in situ and remote detection.

The present invention has broad applications for national security and defense. For example, in situ nuclear detection may be used at border checking posts, airports, seaports and many other locations. Remote nuclear detection may be particularly useful for defense purposes. For in situ nuclear detection, the present invention may be used to detect nuclear materials which are shielded and have a leaking radiation dose rate greater than or equal to about 1 μR/hour.

Figure 1:
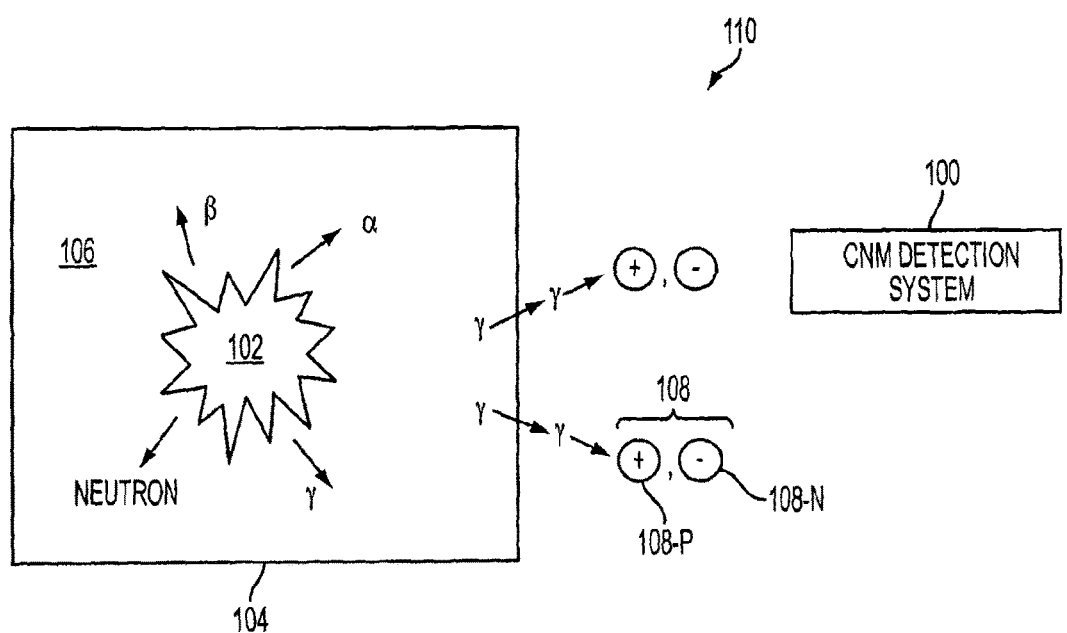
FIG. 1 is a block diagram illustrating ion-based detection of concealed nuclear material by an exemplary concealed nuclear material (CNM) system, according to an aspect of the present invention.

An exemplary system will now be described with reference to the individual figures. FIG. 1 is a block diagram illustrating ion-based detection of concealed nuclear material by an exemplary CNM system 100. Nuclear material 102 is concealed in a shielded enclosure 104. System 100 is located outside of enclosure 104 in atmosphere 110.

Within enclosure 104, material 102 generates ionizing radiation, including α-particles, β-particles, γ-rays, and neutrons. The ionizing radiation has sufficiently high energy to free electrons from molecules in enclosed atmosphere 106. The neutrons do not interact strongly with electrons, and so they cannot directly ionize atoms. However, they interact with atomic nuclei, producing ionizing nuclear recoils and secondary radioactive nuclei, which then emit ionizing radiation into the enclosed atmosphere 106.

Shielded enclosure 104 may represent any suitable container or barrier that may absorb most of the ionizing radiation to conceal the material 102. If nuclear material 102 is shielded by an enclosure 104 made of beryllium, lead, concrete, or water, most of the ionizing radiation and neutrons are absorbed. Remote detection (i.e., direct detection) of the low levels of escaping radiation is typically very difficult in the presence of effective shielding. Of the types of ionizing radiation generated by material 102, high energy γ-rays (e.g., with an energy greater than about 200 KeV) and fast neutrons may pass through enclosure 104.

Air 106 inside enclosure 104 absorbs heavy ionizing radiation, including the direct radiation and secondary radiation emitted by the atoms of the shielding materials after they are activated by nuclear radiation or neutrons. While shielded nuclear materials do not typically need to exchange air with outside atmosphere 110, shielded active nuclear facilities typically ventilate air 106. Accordingly the ventilated air from inside enclosure 104 contains rich ions which may be useful to detect active nuclear facilities. It is expected that the ventilated air contains rich ions, but no radioactive particles. These rich ions are added to the ions produced by radiation leaking through the shielding, making it easier to detect and distinguish active nuclear facilities.

As discussed above, it is possible for high energy γ-rays to pass through enclosure 104 into atmosphere 110. The γ-rays ionize in atmosphere 110 to produce ions 108, including both positive ions 108-P and negative ions 108-N.

System 100 measures the density of negative ions 108-N and positive ions 108-P outside of enclosure 104 in atmosphere 110. The ion density in the air will be relative low if there is no nuclear material present, e.g., below about 250/cm$^3$ for outdoors. For indoors, the ion density may be even lower than 150/cm$^3$ when there is no radiation source. Conversely, a relatively high ion density in air 110 may be indicative of nuclear material 102 located nearby, e.g., above about 1000/cm$^3$.

The surrounding atmosphere may be significantly ionized even if the radiation dose (Ra) outside enclosure 104 is as low as $10^{-6}$ R/h. Under radiation dose Ra (R/h), one liter of atmosphere receives the radiation energy shown in eq. (1) as:

$$1.29 \times 87.6 Ra = 113 Ra^{erg/h} \tag{1}$$

where erg represents a unit of energy equivalent to $10^{-7}$ Joules.

In eq. (1), the density of the atmosphere at ground level is 1.29 g/liter and 1R=87.6 erg/g. Among the major molecules present in air, oxygen is the most easily ionized, with an ionization potential (IP) of 13.6 eV.

As known to one of skill in the art, according to the Penning effect, during collisions and diffusion, almost 100% of the charges in air ions will eventually be transferred to the most stable ion in air. Among the major components of air, e.g., nitrogen and oxygen, negative oxygen ions $O_2^-$ and positive oxygen ions $O_2^+$ are typically the most stable ions. In the presence of some other minor components of air, oxygen ions may give charges to some of the other minor air components, but this process may be slow. Therefore, for simplicity, it is assumed that the above radiation ionizes oxygen molecules (to form positive oxygen ions) and that the released electrons are eventually captured by other oxygen molecules (to become negative oxygen ions). The number of positive ions and negative ions produced in one liter during one hour is shown in eq. (2) as:

$$113 Ra/(13.6 \times 1.6 \times 10^{-12}) = 5.19 \times 10^{12} Ra/(h \cdot liter) \tag{2}$$

Eq. (2) is equivalent to a rate Q to produce respective positive and negative ions as shown in eq. (3) as:

$$Q = 1.44 \times 10^6 Ra/(s \cdot cm^3) \tag{3}$$

Recombination between positive ions and negative ions is a factor to be considered. The recombination may limit the ion density produced, but does not eliminate the ions. The ion density may be represented as n, generally, for both positive and negative ions. The recombination rate is proportional to $an^2$, where a represents the coefficient of recombination.

The equation to determine the ion density n is shown in eq. (4) as:

$$dn = (Q - an^2) dt. \tag{4}$$

A solution for eq. (4) is shown in eq. (5) as:

$$n = \sqrt{Q/a}(1 - e^{-2t\sqrt{Qa}})/(1 + e^{-2t\sqrt{Qa}}). \tag{5}$$

If the time scale τ is defined by eq. (6) as $$\tau = 1/(2\sqrt{Qa}), \tag{6}$$

eq. (5) becomes $$n = \sqrt{Q/a}(1 - e^{-t/\tau})/(1 + e^{-t/\tau}). \tag{7}$$

For oxygen ions, $a = 10^{-6}$ cm$^3$/s. Under the condition that time t is much longer than τ, the ion density may be represented as $n_\infty$, shown in eq. (8) as:

$$n_\infty = \sqrt{Q/a} = 1.2 \times 10^6 \sqrt{Ra}/cm^3 \tag{8}$$

Based on eq. (8), the time scale in eq. (6) may be represented as:

$$\tau = 0.417/\sqrt{Ra}. \tag{9}$$

For Ra=$10^{-6}$, $n_\infty = 1.2 \times 10^3$/cm$^3$ and τ=417 s. These values indicate that at a very low radiation dose such as 1 μR/h, there are still rich ions in the surrounding atmosphere. For a higher radiation dose, e.g., Ra=0.0001, $n_\infty = 1.2 \times 10^4$/cm$^3$ and τ=41.7 seconds. In this example, the ion density $n_\infty$ is much higher and stabilizes very quickly. For most active nuclear facilities, the radiation dose is about 1 mR/h (i.e., Ra=0.001), such that the stable ion density is about 3.79×10$^4$/cm$^3$. In an exemplary embodiment, ion density is determined over a period of time t, several minutes, to accommodate fluctuations in ion density levels.

The radiation dose Ra may be derived from the ion density (eq. (8)), and represented by eq. (10) as:

$$Ra=(0.83\times10^{-6}n_\infty)^2(R/h) \tag{10}$$

Thus, once the ion density of concealed nuclear material is determined, eq. (10) may be used to convert the ion density to a radiation dose.

The spatial distribution of ionized air, produced by the nuclear material, is influenced by the Earth's electric field. This electrostatic field, which is about 100 V/m near the Earth's surface, is produced by the potential difference between the Earth's surface and the Earth's ionosphere. Because of this field, the positive ions drift towards the Earth and become neutralized, while the negative ions drift upward slowly and have a much longer lifetime. Accordingly, there are typically more negative ions around concealed nuclear material. This difference in positive and negative ions may provide a mechanism to distinguish the ions produced by concealed nuclear materials and the ions produced by radon, for example. The air ions produced by radon have mostly positive ions and very few negative ions, which is different from the air ions produced by concealed nuclear materials.

An aspect of the present invention is to detect and locate concealed nuclear material. As discussed above, the shielding typically prevents α-particles from escaping enclosure 104. The radiation that escapes from enclosure 104, instead, are mostly γ-rays. The γ-rays ionize atmosphere 110 through electron-photo emission, producing both positive and negative ions 108, which is indicative of concealed nuclear materials.

On the other hand, the mechanism for α-particles to ionize air is different from γ-rays. Namely, the mechanism for α-particles is solely through collisions. Because α-particles are heavy positive ions, He$^{++}$, the α-particles usually take electrons away from air molecules during the collision. Low energy α-particles, thus, only produce positive air ions. High energy α-particles may kick some electrons away from air molecules to produce positive ions. However, such high energy α-particles are not transmitted out of enclosure 104 and, thus, do not typically exist outside of enclosure 104.

The presence of radon in the air near the ground may produce low-energy α-particles. These low-energy α-particles may ionize atmosphere 110 to produce positive ions and almost no negative ions. The presence of radon may make it possible to detect some α-particles around the concealed nuclear materials. In accordance with one aspect of the present invention, an ionized air sensor (described further below) may be placed within a sealed enclosure 220 (FIG. 2) which contains air at atmospheric conditions. In general, enclosure 220 may allow γ-rays to penetrate, while blocking penetration by α-particles and radon particles. For example, enclosure 220 may include a cardboard box. Because the enclosure 220 permits γ-rays to penetrate, while shielding the enclosure 220 from α-particles and radon particles (i.e. blocking α-particles and radon particles), both positive and negative air ions produced by the radiation from the concealed nuclear materials may be detected, as described further below with reference to FIG. 2. The enclosure 220 may include any sealed enclosure formed from any material that blocks α-particles, but is easily penetrated by γ-rays.

Figure 2:
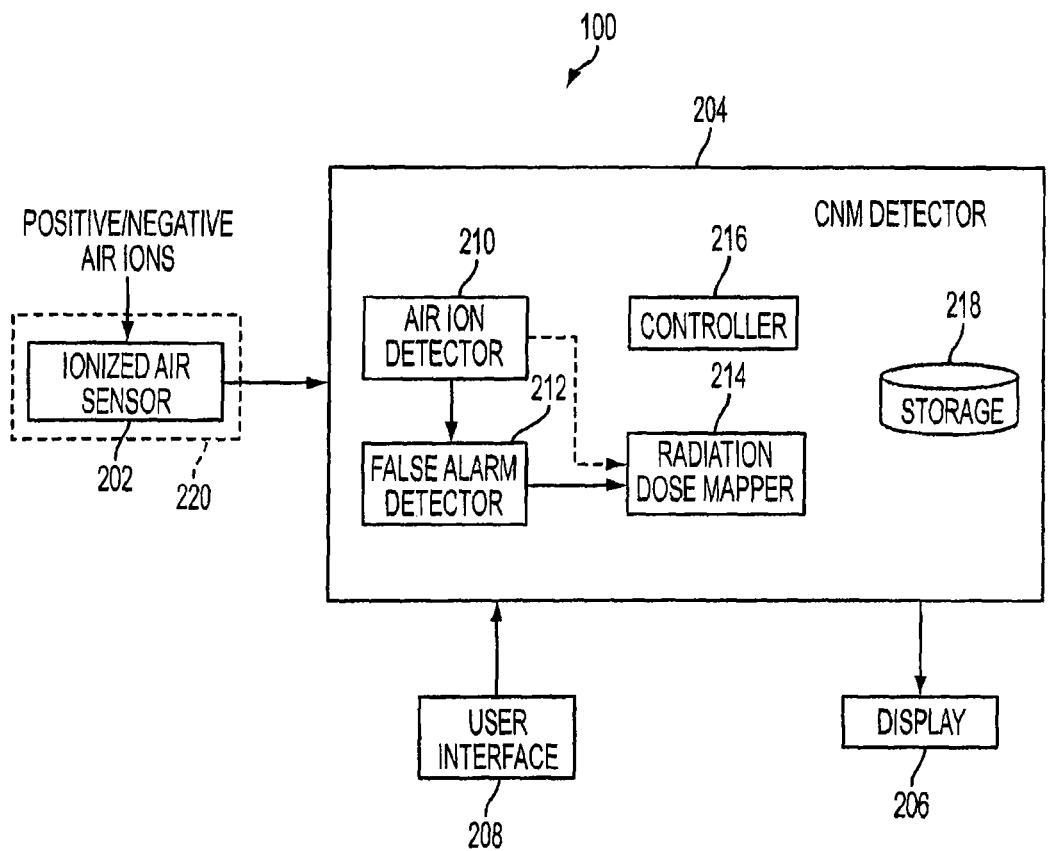
FIG. 2 is a block diagram illustrating the exemplary CNM system shown in FIG. 1, according to an aspect of the present invention.

FIG. 2 is a functional block diagram illustrating exemplary CNM system 100. System 100 includes ionized air sensor 202 for detecting ionized air molecules, CNM detector 204, display 206 and user interface 208. Suitable displays 206 and user interfaces 208 will be understood by one of skill in the art from the description herein.

Ionized air sensor 202 may be used to measure the ionized air at one or more locations near the concealed nuclear material. Ionized air sensor 202 may also be used to measure a background ionized air density representing the environmental ionized air density without the effects of the nuclear material. The background ionized air density may be stored in storage 218 and applied to each subsequent measurement location. According to one embodiment, ionized air sensor 202 is an air-ion counter with a sensitivity of between about 10-100 ions/cm$^3$, desirably about 10 ions/cm$^3$. According to another embodiment, ionized air sensor 202 may include a terahertz or millimeter-wave spectrometer. A sensitivity of ionized air sensor 202 may be selected according to whether in situ or remote detection is performed. A suitable ionized air sensor 202 will be understood by one of skill in the art from the description herein.

As discussed above, ionized air sensor 202 may be placed in sealed enclosure 220 which permits γ-rays to penetrate, while shielding ionized air sensor 202 from α-particles. In this manner, ionized air sensor 202 may measure radiation from concealed nuclear materials, while reducing a possibility by system 100 of detecting false alarms from other radiation sources, described further below.

Display 206 may be configured to display one or more ion densities and/or radiation doses. Display 206 may be configured to display radiation doses for a number of locations as a spatial radiation dose map, described further below. It is contemplated that display 206 may include any display capable of presenting information including textual and/or graphical information.

User interface 208 may be used to initiate ionized air measurements for one or more locations, in order to detect the concealed nuclear material. In addition, user interface 208 may be used to select parameters provided to CNM detector 204 for detection of the concealed nuclear material. User interface 208 may further be used to select ion densities or radiation doses to be displayed and/or stored. User interface 208 may include any suitable interface for initiating measurements and indicating storage and/or display of ion densities/radiation doses. User interface 208 may further include an input device such as a keypad for entering information.

The illustrated CNM detector 204 includes an air ion detector 210, a false alarm detector 212, a radiation dose mapper 214, a controller 216 and storage 218. Controller 216 is configured to receive user inputs from user interface 208, such as measurement indicators, and display a radiation dose map (and/or ion densities) on display 206. Controller 216 is also configured to control/implement air ion detector 210, false alarm detector 212, and radiation dose mapper 214, responsive to user inputs received from user interface 208. Furthermore, controller 216 may also store values for measured ionized air, detected air ion density and/or radiation dose for one or more measurement locations. Controller 216 may be a conventional digital signal processor. It will be understood by one of skill in the art from the description herein that one or more of the functions of air ion detector 210, false alarm detector 212 and radiation dose mapper 214 may be implemented in software and may be performed by controller 216.

Air ion detector 210 receives values for the measured ionized air and detects an ion density of air ions (preferably both positive and negative ions). As discussed above, in addition to nuclear materials, there may be other sources that ionize the atmosphere. Accordingly, air ion detector 210 may determine the ion density of any positive and negative air ions included in the ionized air for use in distinguishing ionization due to concealed nuclear materials from ionization due to other sources. Thus, air ion detector 210 may be used to identify characteristics (the positive and negative air ion densities) that are indicative of the presence of concealed nuclear material.

Air ion detector 210 may subtract a background ionized air density measurement (e.g., stored in storage 218) from the measured ionized air density to remove the environmental ionized air characteristics and to detect the air ion densities. In addition, air ion detector 210 may account for effects of the Earth's electric field, as described above. In general, the air ions may include one or more components that may be used to indicate nuclear material. Among the air ion components, nitrogen ions, oxygen ions, and/or other ions may be detected that may indicate nuclear material, such as $NO_3^-$ and $HSO_4^-$ and $H^+$ $(H_2O)_n$. The detected air ion density may be provided to false alarm detector 212 or may be provided directly to radiation dose mapper 214.

False alarm detector 212 receives the detected positive and negative air ion density values from air ion detector 210 and determines whether the detected air ion densities represents a false alarm. As discussed above, in addition to nuclear materials, there may be other sources that ionize the atmosphere and which may produce air ions. These sources may include the presence of radon, lightning, an approaching thunderstorm, cosmic rays and an electric discharge. False alarm detector 212 may determine whether the positive and negative detected air ion densities correspond to concealed nuclear material or other sources of ionized air, based on the characteristics of the detected air ions, described further below.

As discussed above, radon in the air produces α-particles, which can ionize the atmosphere. However, because α-particles are positive ions, they usually take electrons away from air molecules. Only α-particles with very high kinetic energy may produce some negative oxygen ions by collisions. Accordingly, radon in the air produces positive ions, such as positive oxygen ions $O_2^+$, but very little or no negative ions, such as negative oxygen ions $O_2^-$. Therefore, air ionization by radon and other natural α-particles may be distinguished from air ionization by concealed nuclear materials based on the absence or a minimal concentration of negative ion components, such as oxygen ions, which may be indicative of an ionization source other than concealed nuclear materials. In addition, ionized air sensor 202 may be placed in sealed enclosure 220, as described above, which blocks α-particles.

Lightning and thunderstorms may contribute positive air ion components, such as positive oxygen ions, in the air. Because these ions are not produced during fair weather or indoors, they may not be a concern for in situ nuclear detection. However, for remote nuclear detection, it may be desirable to distinguish air ions produced from lightning and thunderstorms from air ions produced from nuclear material. Lightning mostly contributes positive air ions, whereas nuclear material produces both positive and negative air ions. Several hours before a thunderstorm, the positive air ion concentration may substantially increase, sometimes to about $5000/cm^3$. However, during this period of time the negative air ions density remains small. During a thunderstorm, the negative air ions increase to several thousand per $cm^3$, whereas the positive air ions substantially decrease and may be almost completely absent. Therefore, air ionization by lightning and thunderstorms may be distinguished from air ionization by concealed nuclear materials by simultaneous measurement of the positive and negative air ion densities. For example, if the negative air ion density remains normal, about $250/cm^3$ or below, while the positive air ion density becomes very high, this may indicate that the ions are not produced by concealed nuclear materials. In addition, false detection due to lightning and thunderstorms may be eliminated by placing ionized air sensor 202 in sealed enclosure 220, as described above, which shields ionized air sensor 202 from the air ions produced by lightning and thunderstorms, but which allow the γ-rays from the concealed nuclear materials to pass through. Ionized air sensor 202, as enclosed, may thus detect the concealed nuclear materials without interference from false signals.

Cosmic rays are energetic particles originating from space that impinge on Earth's atmosphere. Almost 90% of all the incoming cosmic ray particles are protons. About 9% of the particles are $10^{20}$ eV, far higher than the $10^{12}$ to $10^{13}$ eV that man-made particle accelerators can typically produce. When cosmic ray particles enter the Earth's atmosphere, they collide with oxygen and nitrogen, to produce a cascade of lighter particles, a so-called air shower, which can be easily distinguished from ionization by nuclear radiation because the produced ions can barely reach the Earth's surface. The cosmic γ-rays produce both positive and negative air ion components, such as oxygen ions, near the Earth's surface. However, the air ion density produced by cosmic γ-rays is much lower than what is produced by nuclear radiation. Therefore, air ionization by cosmic γ-rays may be distinguished from air ionization by concealed nuclear materials by simultaneous measurement of the positive and negative air ion densities, with levels of positive and negative ions below about $250/cm^3$, indicative of an ionization source other than concealed nuclear materials.

Electric discharge will also produce air ion components, such as oxygen ions. For example, one source of electric discharge includes negative ion generators for cleaning the air. Negative ion generators only produce negative air ions. Accordingly, the positive air ion density remains low. Therefore, air ionization by electric discharge may be distinguished from air ionization by nuclear materials based on the absence or a minimal concentration of positive air ions, which is indicative of an ionization source other than concealed nuclear materials. As described above, false detection may be eliminated by placing ionized air sensor 202 in sealed enclosure 220, as described above, which shields ionized air sensor 202 from the air ions produced by electric discharge, but which allows the γ-rays from the concealed nuclear materials to pass through. Accordingly, ionized air sensor 202, as enclosed, may detect the concealed nuclear materials without interference from the false signal.

In general, false alarm detector 212 may distinguish air ions representing concealed nuclear material from other sources based on the presence and concentration of both positive and negative air ions. False alarm detector 212 may provide an indication to radiation dose mapper 214 of a false alarm, such that radiation dose mapper 214 may select a minimum radiation dose for that location. Alternatively, false alarm detector 212 may provide a minimum radiation dose for that measurement location to radiation dose mapper 214. In general, false alarm detector 212 may provide modified detected air ion densities (both positive and negative) to radiation dose mapper 214.

Radiation dose mapper 214 receives the positive and negative air ion density values as modified by false alarm detector 212 and determines a corresponding radiation dose value. For example, the radiation dose may be determined based on eq. (10). The radiation dose may be stored in storage 218 and/or provided to display 206. In addition, radiation dose mapper 214 may arrange radiation doses for multiple locations as a spatial radiation dose map. The spatial radiation dose map may be stored in storage 218 and/or provided to display 206. Typically, the radiation is strongest next to the nuclear material and decays with the distance away from the nuclear material. Therefore, the radiation dose map may be used to indicate the direction and location of the concealed nuclear material. For example, a position with a radiation peak or ion density peak may indicate nuclear material located at that position.

Storage 218 may store measured ionized air from ionized air sensor 202; detected air ion densities (positive and negative) from air ion detector 210; modified air ion densities from false alarm detector 212; radiation doses and/or spatial radiation dose maps from radiation dose mapper 214; and/or background ionized air densities measured by ionized air sensor 202. Storage 218 may be a memory, a magnetic disk, a database or essentially any local or remote device capable of storing data.

It will be understood by one of skill in the art from the description herein that ionized air sensor 202 may be located remote from CNM detector 204, such as for remote measurements. Ionized air sensor 202 may be connected to CNM detector 204 by any suitable wired or wireless connection. It will also be understood that CNM detector 204 may be located remote from display 206.

It is contemplated that CNM system 100 may be configured to connect to a global information network, e.g., the Internet, (not shown) such that the radiation dose map (and/or the detected or modified air ion densities) may also be transmitted to a remote location for further processing and/or storage.

Figure 3A:
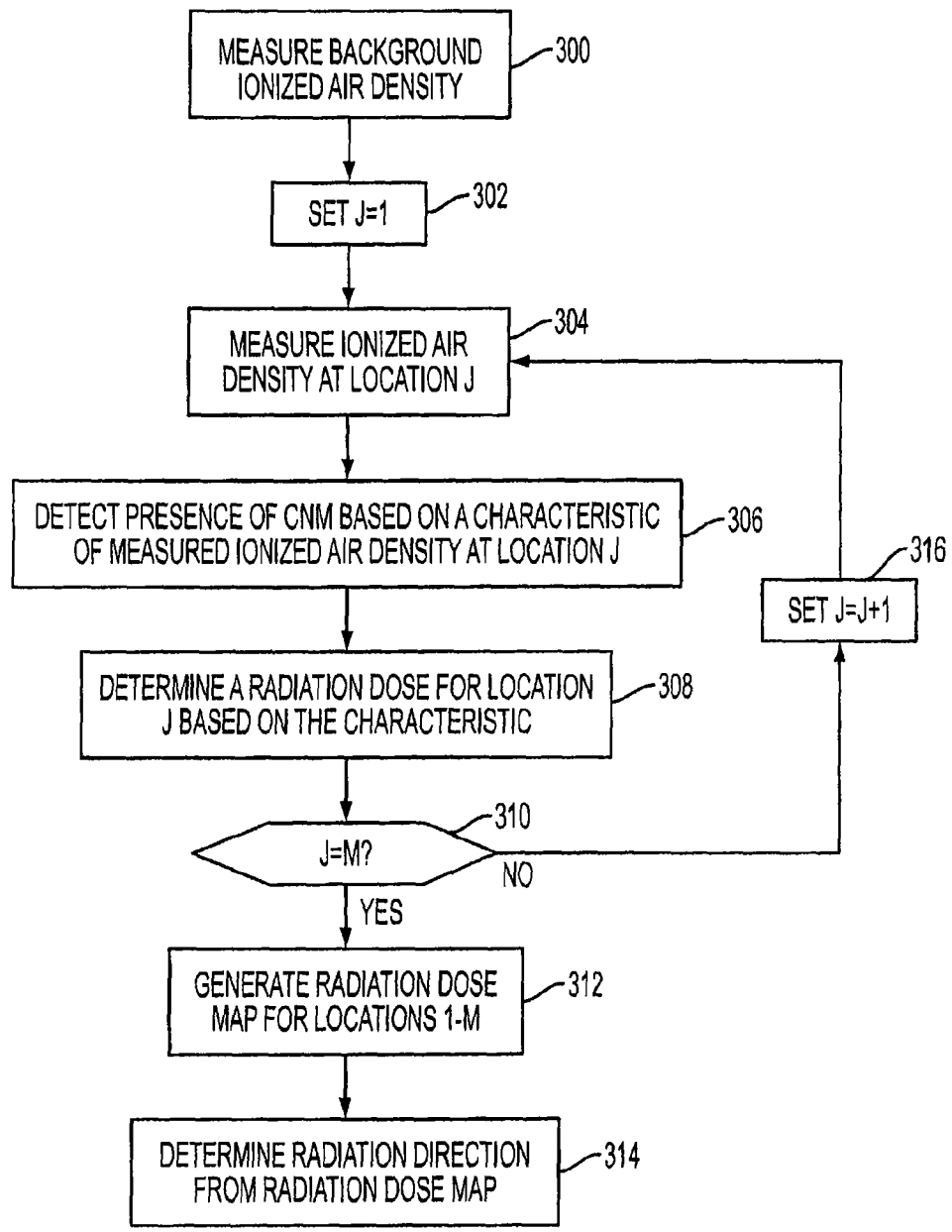
FIG. 3A is a flow chart illustrating an exemplary method for detecting concealed nuclear material, according to an aspect of the present invention.

FIG. 3A is a flow chart illustrating an exemplary method for detecting concealed nuclear material in accordance with an aspect of the invention. At step 300, a background ionized air density is measured, for example, by ionized air sensor 202 (FIG. 2) and stored in storage 218. At step 302, a location index 3 is initialized to 1, for example, by controller 216 (FIG. 2).

At step 304, an ionized air density is measured at location J, for example, by ionized air sensor 202 (FIG. 2). At step 306, the presence of concealed nuclear material is detected based on a characteristic of the air density indicative of concealed nuclear materials measured at location J (step 304), for example, by air ion detector 210 (FIG. 2). At step 308, a radiation dose is determined for location J based on the characteristic of the measured ionized air density, for example, by radiation dose mapper 214 (FIG. 2).

At step 310, it is determined whether index J is equal to M, where M represents a maximum number of locations, for example, by controller 216 (FIG. 2). If J is equal to M, step 310 proceeds to step 312.

At step 310, if it is determined that J is not equal to M, step 310 proceeds to step 316. At step 316, index J is incremented. Step 316 proceeds to step 304, and steps 304-310 are repeated until J is equal to M.

At step 312, a spatial radiation dose map is generated for locations 1 through M, for example, by radiation dose mapper 214 (FIG. 2). At step 314, a radiation direction (i.e. a trajectory) for the concealed nuclear material is determined, for example by a user reviewing the spatial radiation dose map on display 206 (FIG. 2), to locate the nuclear material.

In one embodiment, the process may be completed without generating a radiation dose map and, thus, steps 312 and 314 may be omitted. Additionally, if ionization levels are detected at only one location at a time (i.e., M=1), steps 302, 310 and 316 may be omitted.

Figure 3B:
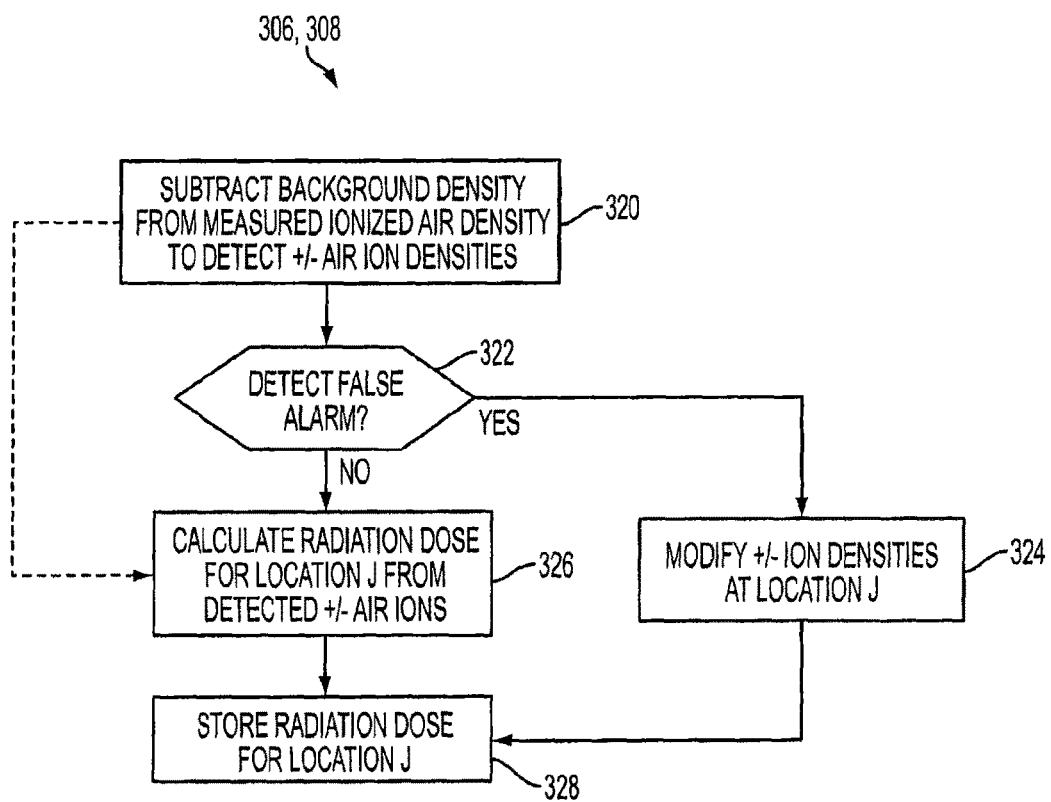
FIG. 3B is a flow chart illustrating an exemplary method for determining a characteristic associated with concealed nuclear material and determining a radiation dose from the characteristic, according to an aspect of the present invention.

FIG. 3B is a flow chart illustrating an exemplary method for detecting concealed nuclear materials (step 306 in FIG. 3A) and determining radiation dose levels (step 308 in FIG. 3A), in accordance with an aspect of the invention. At step 320, the background ionized air density (step 300 in FIG. 3A) is subtracted from the air density measured at location J (step 304 in FIG. 3A) to detect positive and negative air ion densities, for example, by air ion detector 210 (FIG. 2). The positive and negative air ion densities represent the characteristic used in accordance with an exemplary embodiment to detect the presence of concealed nuclear material.

At step 322, it is determined whether any false alarms are detected, for example, by false alarm detector 212 (FIG. 2). If a false alarm is detected, processing proceeds to step 324. If a false alarm is not detected (i.e., concealed nuclear materials are detected), processing proceeds to step 326.

At step 324, the positive and negative air ion densities for a location are modified such that the radiation dose for that location is set to a minimum dose, for example, by false alarm detector 212 (FIG. 2).

At step 326, the radiation dose is calculated for location J using the positive and negative detected air ion densities, for example, by radiation dose mapper 214 (FIG. 2). At step 328, the radiation dose calculated from step 326 or the minimal radiation dose from step 324 is stored, for example, in storage 218 (FIG. 2).

It will be understood by one of skill in the art from the description herein that steps 320-328 represent an exemplary embodiment. In an alternative embodiment, steps 322 and 324 may be omitted, such that processing after step 320 may proceed to step 326.

The present invention is illustrated by reference to a number of examples. The examples are included to more clearly demonstrate the overall nature of the invention. These examples are exemplary, and not restrictive of the invention.

Example Of In Situ Detection

Experiments were conducted to measure the air ions produced by radiation from uranium isotope $U^{238}$. The radioactive uranium was sealed in a small metal box. The metal box itself was placed in one side of a locked metal storage cabinet having a height of 200 cm, a width of 90 cm, and a depth of 45 cm.

The double shielding by the small box and the cabinet substantially blocked any α-particles and β-particles from being transmitted outside of the cabinet. However, high energy γ-rays and neutrons were transmitted out of the cabinet. The highest radiation dose outside the cabinet was measured as 0.1 mR/h. The measurement was made by a Geiger counter at a position near the middle of cabinet wall, which was about 1 cm from the radiation source.

The radiation dose decayed very rapidly as the distance to the cabinet increased. It was determined that the radiation dose decays at a rate of $1/r^2$, where r is the distance from the source. At a distance of about 10 cm from the cabinet, the radiation dose became 1 μR/h, too weak to be detected by the Geiger counter and many conventional detectors.

In contrast, a high density of ions in the air were detected even at a distance of one meter from the cabinet. An air-ion counter, having a relatively high sensitivity of about 10 ions/cm$^3$ within the range of about 10-1,999,000 ions/cm$^3$, was used to measure the air ions. The air-ion counter was used to measure both negative ion density and positive ion density. According to the Penning effect, during collisions and diffusion, almost 100% of the charges in air ions will eventually be transferred to the most stable ion component in the air (e.g., negative oxygen ions and positive oxygen ions), but the ion density remains the same. Therefore, the negative air ion density measured with the device should be close to the actual negative air ion density.

In this example, oxygen ions were measured. First the negative air ions were measured. To avoid any effects due to the metal cabinet wall, the measurement was initiated about 10 cm away from the cabinet, where the radiation dose was about 1 μR/h. It was determined that negative ions in the air at 10 cm from the cabinet was about 2500/cm$^3$, higher than the estimation according Eq. (8), 1280/cm$^3$. This result may be due to a diffusion of high density of ions from the cabinet to the surrounding atmosphere. It was observed that, as the leaking radiation fluctuated, the density of negative ions fluctuated with the radiation intensity.

TABLE 1

Change of Negative ion Density vs. Horizontal Distance from Cabinet

| Horizon distance (cm) | 10 | 50 | 70 | 100 |
|---|---|---|---|---|
| Negative ion density (1/cm$^3$) | 2500 | 1660 | 1300 | 830 |

Table 1 shows the negative ion density as a function of distance (r) to the source. Table 1 shows that the negative ion density decreases as the distance increases. If diffusion is not taken into consideration, according to Eq. (8), the ion density should decrease as the inverse of the distance to the source (because the radiation dose decreases as the inverse of the square of the distance to the source). However, the reduction rate of ion density is less than $r^{-1}$. For example, about one meter of horizontal distance away from the cabinet, the ion density should be about 250/cm$^3$ if the ion density decreases as $r^{-1}$. The measurements showed, instead, a negative air ion density of about 830/cm$^3$. Based on these results, it is clear that the diffusion plays an important role in the reduction rate of ion density. The negative air ions also have a relatively long lifetime of about several minutes. A combination of these two effects (i.e., the reduction rate of ion density and the time in the atmosphere) may aid in detecting a high density of negative air ions at a relatively large a distance away from the source.

Figure 4:
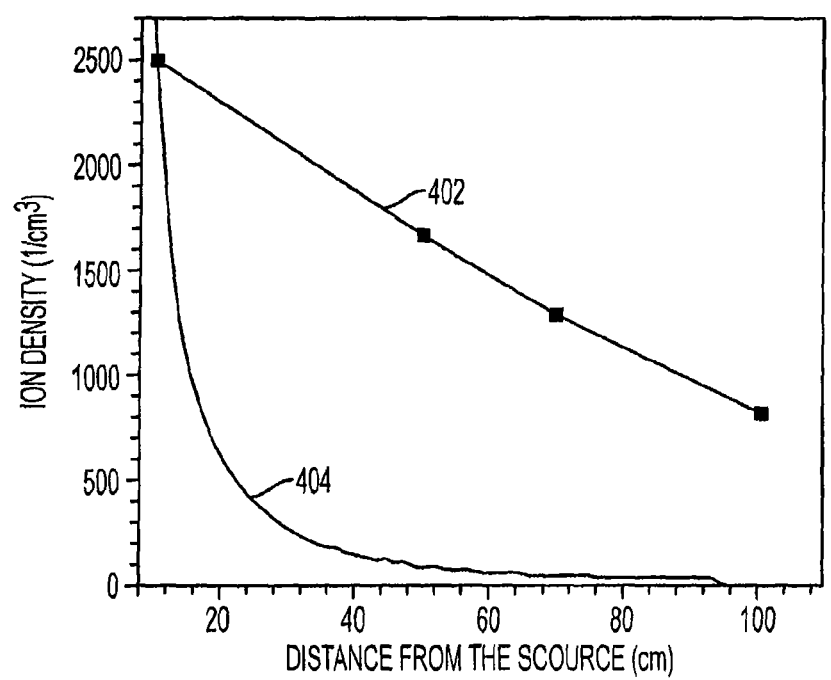
FIG. 4 is a graph of measured ion density as a function of distance from a concealed radiation source illustrating an example of a rate of ion density reduction with distance from the source in comparison with a rate of leaking radiation intensity reduction with distance from the source, according to an aspect of the present invention.

Referring to FIG. 4, a graph of the measured negative air ion density 402 as a function of distance from the source is shown. For a comparison, the radiation dose 404 as a function of distance from the source is also shown. In FIG. 4, the radiation dose is estimated as 0.1 mR/h/r$^2$, where r is the distance to the source (in cm). It can be appreciated that the ion density 402 is reduced at a much slower rate compared to the radiation dose 404.

The reduction rate of the negative ion density along the vertical distance from the radiation source was found to be even slower than that along the horizontal direction. For example, at about one meter from the radiation source, the negative ion density was about 1000/cm$^3$, as compared to about 830/cm$^3$ at a horizontal distance of one meter.

The positive air ion density was also measured. A significant density of positive air ions were measured in the air. However, a slightly greater density of negative air ions than positive air ions was observed in the surrounding distance from the cabinet. For example, at a 10 cm horizontal distance from the cabinet, the positive air ion density was about 1,500/cm$^3$, whereas the negative air ion density was about 2,500/cm$^3$. At a one meter horizontal distance from the cabinet, the positive air ion density was about 400/cm$^3$ less than the density of negative ions, 830/cm$^3$.

The above results can be explained with respect to the effects of the Earth's electric field. The Earth's electric field is about 100 V/m near the Earth's surface, along the radial direction and pointing down, and produced by the potential difference between the Earth's surface and the ionosphere. The Earth's electric field drives the negative air ions (e.g., negative oxygen ions) upward and the positive air ions (e.g., positive oxygen ions) downward. Because of this electric field, some positive air ions hit the Earth's surface and are discharged, while the negative air ions slowly move upward. Accordingly, the surrounding area of the radiation source may include more negative air ions than positive air ions. The negative air ions in the atmosphere have a mobility of about 4 cm$^2$/V·s, which gives an upward drift velocity of about 4 cm/s. The diffusion of the negative air ions is, thus, not uniform, favoring the upward direction. The positive air ions favor the downward direction for diffusion. Once the positive air ions reach the Earth's ground, they are discharged. Therefore, the positive air ion density may be lower than the negative air ion density.

In summary, the measurements confirm that even with a very low leaking radiation dose, which could not be detected by a conventional Geiger counter, a positive air ion density and negative air ion density produced by the nuclear radiation in the surrounding air are high enough to be detected in situ and remotely.

Example Of Remote Detection

The high density of ions in the air can also be detected and measured remotely, according to another embodiment of the present invention. Because of the Penning effect, most of the negative ions are typically $O_2$ ions and other stable ions. Accordingly, for this example, an electrostatic air cleaner (an Ionic Breeze Quadra® by Sharper Image) was used to produce negative $O_2$ ions.

Figure 5:
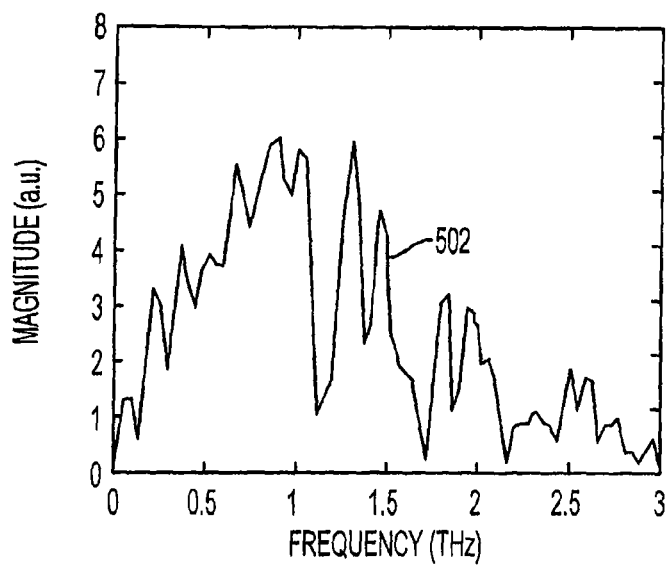
FIG. 5 is a graph of a transmission spectrum of ionized air illustrating an example of ion characteristics that may be used to detect concealed nuclear material, according to an aspect of the present invention.

First, the spectrum of negative $O_2$ ions was examined with terahertz spectroscopy. In FIG. 5 the transmission spectra 502 of THz radiation through the generated ionized air is shown. Transmission spectra 502 represents the negative $O_2$ ions with any background ionized air (due to the neutral air) subtracted. As shown in FIG. 5, there is a strong absorption at around 1.03 THz. This absorption corresponds to the negative $O_2$ ions.

Figure 6:
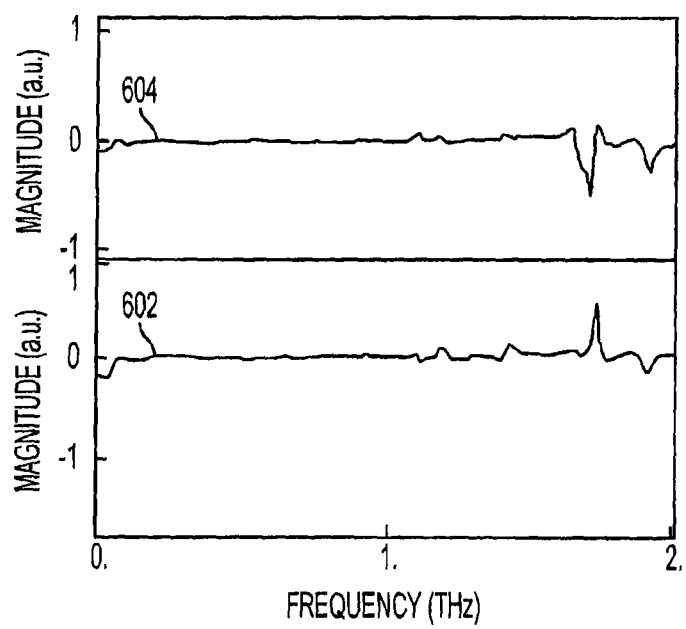
FIG. 6 is a graph of absorbance spectra of ionized air produced by radioactive thorium or uranium isotopes illustrating another example of ion characteristics that may be used to detect concealed nuclear material, according to an aspect of the present invention.

Next, the terahertz spectrometer was used to detect ionized air produced by two different radioactive isotopes, thorium and uranium-238. The thorium was provided on a wiping cloth that was contaminated by a thorium spill. A Geiger counter in contact with the cloth indicated a radiation dose of about 3 mRad/hour. The terahertz spectrometer was positioned about 3 cm away from the thorium. At this position (3 cm), the Geiger counter could not determine the radiation dose, indicating that the radiation dose at the spectrometer was lower than the sensitivity of the Geiger counter (of about <<1 mR/hour). However, as shown in FIG. 6, the absorbance spectra 602 for thorium indicates a minimum at about 1.03 THz. Absorbance spectra 602 for thorium also indicates peaks and minima at higher frequencies, such as at about 1.7 THz, to the minima shown in transmission spectra 402 of FIG. 4. These results indicate the existence of an ionized atmosphere, particularly negative $O_2$ ions.

The absorbance spectra 602, 604 were extracted from the respective terahertz spectra using the following definition:

$$\text{Absorbance} = -\log[(A_{sample}/A_{ref})2],$$

where $A_{sample}$ and $A_{ref}$ are the amplitudes of the respective sample and reference spectra.

The isotope uranium had a radioactivity of about 15 μCurie. The absorbance spectra 604 of uranium in FIG. 6 clearly shows the existence of an ionized atmosphere, particularly for the negative $O_2$ ions.

A comparison of the respective absorbance spectra 602, 604 curves for thorium and uranium illustrate that the air ion density and hence the radiation dose may be remotely detected. As described above, for thorium, although the Geiger counter could not read the radiation dose at the spectrometer, the spectrometer was able to detect the ionized atmosphere.

Although not shown, a terahertz (or millimeter-wave) spectrometer may be used to remotely detect positive $O_2$ ions, other negative air ions, and other positive ions in the air.

Although the invention has been described in terms of systems and methods for detecting concealed nuclear material, it is contemplated that one or more steps and/or components may be implemented in software for use with microprocessors/general purpose computers (not shown). In this embodiment, one or more of the functions of the various components and/or steps described above may be implemented in software that controls a computer. The software may be embodied in tangible computer readable media (such as, by way of non-limiting example, a magnetic disk, optical disk, hard drive, etc.) for execution by the computer.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method for detecting nuclear material concealed within an enclosure comprising:
    measuring a density of ions in air at one or more locations outside of the enclosure using one or more ionized air sensors, the ions selected from the group consisting of $O_2^-$, $NO_3^-$, $HSO_4^-$ or $H^+(H_2O)_n$;
    comparing the measured density of ions in the air with a predetermined background density of ions in air an absence of nuclear material, the comparing including:
        determining a positive ion density and a negative ion density generated by the concealed nuclear material, and
        distinguishing radiation generated by the concealed nuclear material from other sources of ionized air based on a difference between the positive ion density and the negative ion density;
    calculating a radiation dose at the one or more locations based on the comparison of the measured density of ions in the air with the predetermined background density; and
    generating a spatial radiation dose map for determining the location of the concealed nuclear material based on the calculated radiation dose at the one or more locations.

2. A method according to claim 1, the method including, prior to measuring the density of ions in the air:
    predetermining the background density of ions in the air in an absence of nuclear material,
    wherein the comparing comprises subtracting the predetermined background density from the measured density of ions in the air to obtain a net ion density.

3. A method according to claim 1, further including:
    calculating the radiation dose from the net positive ion density and the net negative ion density generated by the concealed nuclear material for each location.

4. A method according to claim 1, further including:
    displaying the spatial radiation dose map on a display.

5. The method according to claim 1, wherein the measuring is performed in situ.

6. A system for detecting nuclear material concealed within an enclosure comprising:
    an ionized air sensor configured to measure a density of ions in air at one or more locations outside of the enclosure, the ions selected from the group consisting of $O_2^-$, $NO_3^-$, $HSO_4^-$ or $H^+(H_2O)_n$, the ionized air sensor comprising an air ion detector configured to detect, for each of the one or more locations, a positive ion density and a negative ion density from the measured density of ions in the air; and
    a concealed nuclear material detector configured to detect, for each of the one or more locations, the presence of the concealed nuclear material based on the positive ion density and the negative ion density, the detecting including distinguishing radiation generated by the concealed nuclear material from other sources of ionized air based on the positive ion density and the negative ion density, and calculating a radiation dose, for each of the locations, from the respective detected positive ion density and the negative ion density.

7. A system according to claim 6, wherein the ionized air sensor includes an air-ion counter.

8. A system according to claim 6, wherein the ionized air sensor includes one of a terahertz spectrometer or a millimeter-wave spectrometer.

9. A system according to claim 6, further comprising:
    a sealed enclosure surrounding the ionized air sensor, the sealed enclosure configured to pass radiation generated by the concealed nuclear material and to block radiation from at least one other source of ionized air.

10. A system according to claim 9, wherein the blocked radiation includes alpha particles.

11. A system according to claim 9, wherein the at least one other source of ionized air is selected from the group consisting of radon, lightning, a thunderstorm, or electric discharge.

* * * * *